(12) United States Patent
Laine et al.

(10) Patent No.: US 9,490,243 B2
(45) Date of Patent: Nov. 8, 2016

(54) SEMICONDUCTOR DEVICE COMPRISING AN ESD PROTECTION DEVICE, AN ESD PROTECTION CIRCUITRY, AN INTEGRATED CIRCUIT AND A METHOD OF MANUFACTURING A SEMICONDUCTOR DEVICE

(75) Inventors: Jean Philippe Laine, Cugnaux (FR); Patrice Besse, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 26 days.

(21) Appl. No.: 14/419,064

(22) PCT Filed: Aug. 22, 2012

(86) PCT No.: PCT/IB2012/001774
§ 371 (c)(1),
(2), (4) Date: Feb. 2, 2015

(87) PCT Pub. No.: WO2014/030026
PCT Pub. Date: Feb. 27, 2014

(65) Prior Publication Data
US 2015/0311193 A1  Oct. 29, 2015

(51) Int. Cl.
| | |
|---|---|
| *H01L 27/02* | (2006.01) |
| *H01L 21/8222* | (2006.01) |
| *H01L 27/06* | (2006.01) |
| *H01L 29/06* | (2006.01) |
| *H01L 29/10* | (2006.01) |

(52) U.S. Cl.
CPC ....... *H01L 27/0259* (2013.01); *H01L 21/8222* (2013.01); *H01L 27/0255* (2013.01); *H01L 27/0647* (2013.01); *H01L 29/0649* (2013.01); *H01L 29/1095* (2013.01)

(58) Field of Classification Search
CPC .................................................. H01L 27/0259
See application file for complete search history.

(56) References Cited

U.S. PATENT DOCUMENTS

| | | |
|---|---|---|
| 8,022,505 B2 | 9/2011 | Renaud et al. |
| 2006/0163660 A1 | 7/2006 | Jin |
| 2010/0320501 A1 | 12/2010 | Gendron et al. |
| 2011/0058293 A1 | 3/2011 | Pardoen et al. |
| 2011/0169092 A1 | 7/2011 | Ikuta et al. |

(Continued)

FOREIGN PATENT DOCUMENTS

EP  2442359 A1  4/2012

OTHER PUBLICATIONS

International Search Report and Written Opinion correlating to PCT/IB2012/001774 dated Apr. 4, 2013.

(Continued)

*Primary Examiner* — Lex Malsawma

(57) ABSTRACT

A semiconductor device is provided which comprises an ESD protection device. The ESD protection device is being formed by one or more pnp transistors which are present in the structure of the semiconductor device. The semiconductor device comprises two portions, of an isolated p-doped region which are separated by an N-doped region. Two p-doped regions are provided within the two portions. The p-dopant concentration of the two-doped region is higher than the p-dopant concentration of the isolated p-doped region. A first electrical contact is connected only via a highly doped p-contact region to the first p-doped region and a second electrical contact is connected only via another highly doped p-contact region to the second p-doped region.

17 Claims, 7 Drawing Sheets

(56) References Cited

U.S. PATENT DOCUMENTS

2011/0176244 A1  7/2011  Gendron et al.
2012/0119331 A1  5/2012  Gendron et al.

OTHER PUBLICATIONS

Gendron et al: "New High Voltage ESD Protection Devices Based on Bipolar Transistors for Automotive Applications", IEEE, Electrical Overstress/Electrostatic Discharge Symposium (EOS/ESD), 2011 33rd, Anaheim, CA, Sep. 11-16, 2011, pp. 1-10.

SEMICONDUCTOR DEVICE COMPRISING AN ESD PROTECTION DEVICE, AN ESD PROTECTION CIRCUITRY, AN INTEGRATED CIRCUIT AND A METHOD OF MANUFACTURING A SEMICONDUCTOR DEVICE

FIELD OF THE INVENTION

This invention relates to semiconductor devices which comprises an ESD protection device. The invention further relates to an ESD protection circuitry, an integrated circuit and a method of manufacturing a semiconductor device.

BACKGROUND OF THE INVENTION

Electrostatic discharge (ESD) is a problem in the utilization, manufacturing and/or design of the semiconductor devices. The integrated circuits manufactured on the semiconductor device can be damaged when ESD events are received from other circuits coupled to the semiconductor device or from people and/or machinery and tools touching the semiconductor device. During an ESD event the integrated circuit may receive a charge which leads to relatively large voltages during a relatively short period of time. If, for example, the integrated circuit breaks down as the result of the high voltage and starts to conduct the charge of the ESD event, a current of several amperes may flow through the integrated circuit during a relatively short period of time. These currents may cause irreparable damage to the integrated circuit.

Today most integrated circuits comprise ESD protection circuitries that are able to conduct the charge of an ESD event to, for example, the ground without causing irreparable damage to the integrated circuit. Such ESD protection circuits are typically arranged near the I/O pads of the semiconductor device and are configured to conduct the charge of the ESD event directly to the ground before the current may reach the vulnerable portions of the integrated circuit.

In published article "New High Voltage ESD Protection Devices Based on Bipolar Transistors for Automotive Applications", Gendron A. et al, 33th Electrical Overstress/Electrostatic Discharge Symposium, 11-16 Sep. 2011, a cross-sectional view of the structure of an ESD protection device as presented in FIG. 1a and FIG. 2a are usable ESD protection devices for automotive applications. The presented structure and circuit is especially well capable of protecting integrated circuits which are classified as "high voltage circuits", which means in practical cases that such integrated circuits switch voltages which are higher than 5 Volts.

If the I/O pad of the semiconductor device 100 receives an ESD event of a positive voltage, the semiconductor device forms the indicated circuit of transistors T1 and T2 as presented in FIG. 1a and FIG. 1b. The circuit of transistors T1 and T2 form a thrysistor-like circuit, also often indicated with the term Silicon Controlled Rectifier (SCR). As soon as the voltage across the reverse biased N-P junction from the central N-doped region towards the P-doped region 102 becomes higher than the breakdown voltage of this junction, an avalanche phenomenon by impact ionization is created. A hole current flows through from the p-doped region 102. The p-doped region is resistive and once the voltage difference between the N-doped region (which is connected to ground) and the p-doped region 102 becomes larger than 0.3 volt, transistor T2 starts to operate, and, thus, the presented SCR starts to conduct a current from the I/O pad towards the negative or ground voltage. Thus, the breakdown voltage of the discussed junction is the trigger voltage of the ESD protection device. The start of the operation of the SCR causes the reduction of the voltage across the ESD protection device. This reduction of the voltage is termed 'the snapback behaviour' of the ESD protection device. If, subsequently, the current through the ESD protection device increases, the voltage across the ESD protection device also increases until a complete breakdown of the structure. In FIG. 1c the typical behaviour of such an ESD protection device is presented. As shown in FIG. 1c, if the voltage of the ESD event raises to the trigger voltage $V_t$ the operation of the SCR starts and the voltage drops towards the holding voltage $V_h$. The difference between the trigger voltage $V_t$ and the holding voltage $V_h$ is called the snapback voltage $V_{sb}$. Subsequently, the ESD protection device is capable of conducting larger currents until the ESD protection device breaks down at point 162.

In many applications, a strong snapback behaviour is not desired and, in other application, even no snapback behaviour is allowed. Consequently, the ESD protection device of the cited patent application can not be used in such applications.

SUMMARY OF THE INVENTION

The present invention provides a as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 2A:
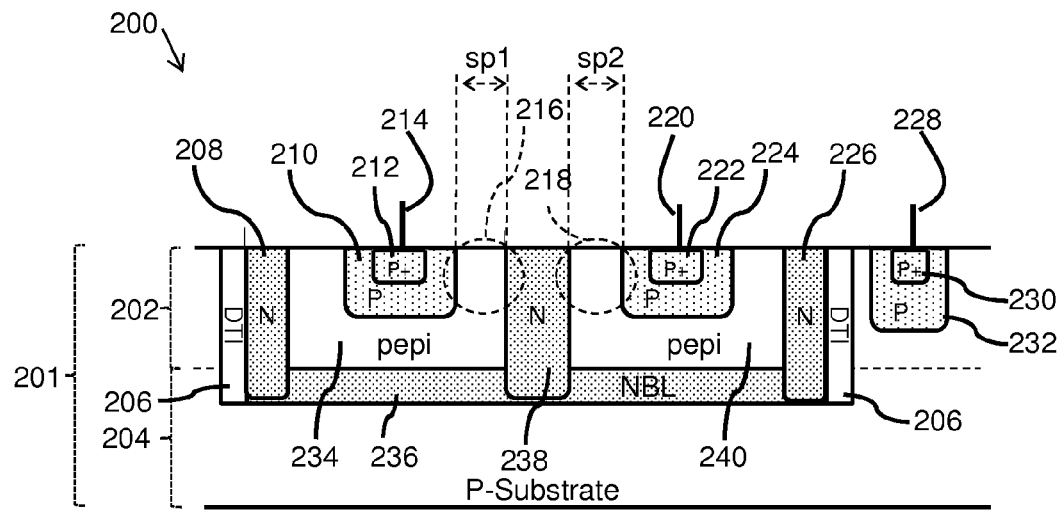

FIG. 2a schematically shows an example of a semiconductor device 200 according to the first aspect of the invention. FIG. 2a presents a cross-sectional view of an ESD protection device which is manufactured in the semiconductor device 200. It is to be noted that the presented structure may extends in a direction perpendicular to the plane of the figure and that certain structures may form a ring or casket around a structure.

The semiconductor device 200 comprises, as a base, a p-doped substrate 204 of a semiconductor material. The substrate 204 is lightly doped with p-type material. In the p-doped substrate 204 is manufactured an N-buried layer NBL, 236, which comprises a relatively large amount of N-type material. On top of the p-doped substrate 204 is manufactured a p-doped epitaxy layer 202. The p-doped substrate 204 and the p-doped epitaxy layer 202 form the semiconductor substrate 201. In the context of this document it is only important that the epitaxy layer 202 is p-doped and that the substrate 204 is p-doped—the amount of p-dopants in the epitaxy layer 202 and the p-doped substrate 204 may differ from each other. The N-buried layer NBL, 236 is present adjacent to the interface between the p-doped substrate 204 and the p-doped epitaxy layer 202.

Within the combination of the p-doped substrate 204 and the p-doped epitaxy layer 202 is created an isolation structure. In the example of FIG. 2a, the isolation structure comprises a Deep Trench Isolation structure DTI, 206 which encloses an isolated portion PEPI of the p-doped epitaxy layer 202. The Deep Trench Isolation structure DTI, 206 extends from a surface of the p-doped epitaxy layer until the end of the N-buried layer NBL, 236. The isolation structure further comprises the N-buried layer NBL, 236 which forms an isolation layer between the p-doped substrate 204 and the isolated portion PEPI. The isolation structure further comprises an highly N-doped structure N, 208, 226 which extends from a surface of the p-doped epitaxy layer 202 towards the N-buried layer NBL. The highly N-doped structure N, 208, 226 is adjacent to the Deep Trench Isolation structure DTI, 206. It is to be noted that the Deep Trench Isolation structure DTI, 206 and the highly N-doped structure N, 208, 226 are presented in a cross-sectional view. These structures extend into a direction perpendicular to the plane of the figure and enclose the isolated portion PEPI. The isolated portion PEPI of the p-doped epitaxy layer 202 may, in other embodiments, be an isolated p-doped structure which is manufactured in another p-doped semiconductor layer—examples are a p-minus doped substrate, a P+ doped substrate, a layer manufactured as Silicon on Insolator (SOI). In the context of the invention the most important feature is that he isolated portion is p-doped.

The semiconductor device 200 further comprises an N-doped region N, 238 which is not part of the isolation structure. The N-doped region N, 238 extends from the surface of the p-doped epitaxy layer into the isolated portion PEPI towards the N-buried layer NBL, 236. Thereby the N-doped region N, 238 subdivides the isolation portion PEPI into a first portion 234 and a second portion 240.

In the first portion 234 of the isolated portion PEPI is manufactured a first p-doped region 210 which extends from the surface of the p-doped epitaxy layer 202 into the first portion 234. It is to be noted that the first p-doped region 210 does not completely extend towards the N-buried layer NBL, 236. The first p-doped region 210 has a specific concentration of p-dopants which is higher than the concentration of p-dopants in the p-doped epitaxy layer 202. Inside this first p-doped region 210 is provided a first contact region 212 which extends from the surface of the p-doped epitaxy layer 202 into the first p-doped region 210. The first contact region 212 is highly doped with a p-type material. The concentration of the p-dopants of the first contact region 212 is higher than the concentration of p-dopants in the first p-doped region 210. The first contact region 212 is connected to a first electrical contact 214 which is configured to be electrically coupled to a structure of the semiconductor device which is susceptible for ESD events. Thus, the first electrical contact 214 connects the first contact region 212, and, thus, the first p-doped region to, for example, an I/O pad of the semiconductor device.

In the second portion 240 of the isolated portion PEPI is manufactured a second p-doped region 224 which extends from the surface of the p-doped epitaxy layer 202 into the first portion 240. It is to be noted that the second p-doped region 224 does not completely extend towards the N-buried layer NBL, 236. The second p-doped region 224 has a specific concentration of p-dopants which is higher than the concentration of p-dopants in the p-doped epitaxy layer 202. Inside this second p-doped region 224 is provided a second contact region 222 which extends from the surface of the p-doped epitaxy layer 202 into the second p-doped region 224. The second contact region 222 is highly doped with a p-type material. The concentration of the p-dopants of the second contact region 222 is higher than the concentration of p-dopants in the second p-doped region 224. The second contact region 222 is connected to a second electrical contact 220 which is configured to be electrically coupled to a negative voltage, or at least to the ground voltage. In an embodiment the second electrical contact is configured to be coupled to the most negative voltage available on the semiconductor device—assuming that the semiconductor device operates under normal operational conditions (and, thus, does not receive an ESD event). Thus, the second electrical contact 214 connects the second contact region 212, and, thus, the second p-doped region 224 to a negative voltage (or to a ground voltage if the ground voltage is the lowest voltage available).

A third electrical contact 228 is electrically connected to a remaining part of the p-doped epitaxy layer 202 which is not the isolated portion. The third electrical contact 228 is coupled to a highly p-doped region 230 which is enclosed by a p-doped region 232 which is manufactured within the remaining part of the p-doped epitaxy layer—the remaining part is not the isolated portion of the p-doped epitaxy layer 202. The third electrical contact 228 is configured to be connected to the substrate voltage. The substrate voltage may be equal to a ground voltage.

A first section 216 of the first portion 234 and a second section 218 of the second portion 240 are indicated in FIG. 2a. The first section 216 is a section of the first portion 234 which is in between the first p-doped region 210 and the N-doped region 238. The second section 218 is a section of the second portion 240 which is in between the second p-doped region 224 and the N-doped region 238. The first section 216 is provides a first spacing distance sp1 between the first p-doped region 210 and the N-doped region 238. The second section 218 provides a second spacing distance sp2 the second p-doped region 224 and the N-doped region 238. As shown in the Figures, the spacing distances sp1 and sp2 are larger than 0, which means that the first p-doped region 210 does not touch the N-doped region 238 and which means that the second p-doped region 224 does not touch the N-doped region. If the respective regions do not touch each other, another material is in between them, which are the respective sections of the first portion and of the second portion.

The spacing distances sp1 and sp2 are measured along a shortest line from, respectively, the first p-doped region 210 and the second p-doped region towards the N-doped region 238. The first section and the second section are important in the operation of the ESD device which is formed by the structure presented in FIG. 2a. A first breakdown voltage of a reverse biased N-P-junction from the N-doped region 238 to the first p-doped region 210 strongly depends on the first spacing distance sp1. A second breakdown voltage of a reverse biased N-P-junction from the N-doped region 238 to the second p-doped region 224 strongly depends on the second spacing distance sp2.

It is to be noted that it is not necessary that the substrate is subdivided in a p-doped substrate 204 and a p-doped epitaxy layer 202. In the context of the invention it is necessary that the isolated portion PEPI is a region which is p-doped, which has an N-buried layer at its bottom, and which is isolated from other circuitry on the same semiconductor device 200. Such an isolated portion PEPI may be obtained by manufacturing a N-buried layer in a p-doped substrate 204 and manufacturing a p-doped epitaxy layer on top of it and manufacturing an isolation structure. In other embodiments, one may manufacture a Silicon on Isolution (SOI) structure, which is p-doped, and which comprises an N-buried layer.

Figure 1A:
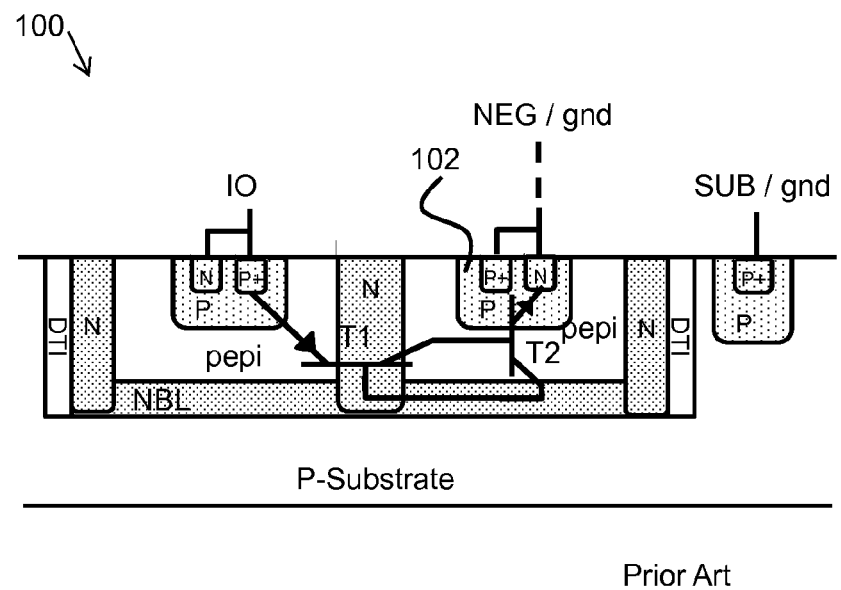
FIG. 1a schematically shows a structure of a prior art ESD protection device.
Figure 1B:
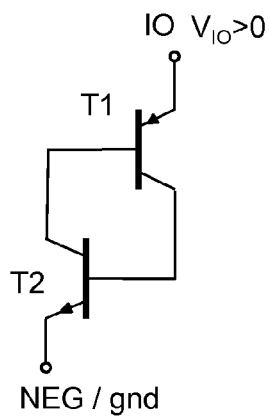
FIG. 1b schematically presents the operational characteristics of the prior art ESD protection device, FIG. 2a schematically shows in a cross-sectional view an example of a semiconductor device according to the first aspect of the invention, FIG. 2b schematically shows a similar example of a semiconductor device, FIG. 3a schematically shows an operation of an example of a semiconductor device in case a positively polarized ESD event is received, FIG. 3b schematically shows a corresponding circuit diagram, FIG. 4a schematically shows an operation of an example of a semiconductor device in case a negatively polarized ESD event is received, FIG. 4b schematically shows a corresponding circuit diagram, FIG. 5a schematically shows an operation of another example of a semiconductor device in case a negatively polarized ESD event is received, FIG. 5b schematically shows a corresponding circuit diagram, and FIG. 6 schematically shows the operational characteristics of several examples of the semiconductor device according to the invention, FIG. 7 schematically shows a manufacturing method of manufacturing a semiconductor device comprising an ESD protection device together with intermediate manufacturing results.
Figure 1C:
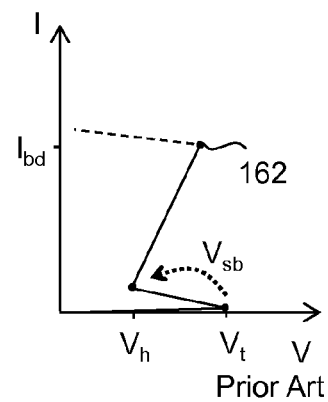

It is further to be noted, when the structure of FIG. 2a is compared with the structure of FIG. 1a, the most prominent difference is the lack of N-doped contact areas within the first p-doped region 210 and within the second p-doped region 224. Because the electrical contacts are only made via a p-doped contact region 212, 222, the structure of the semiconductor device 200 operates in accordance with the description of FIGS. 3, 4 and 5. The structure of semiconductor device 200 does not operate as an Silicon Controlled Rectifier (SCR).

Figure 2B:
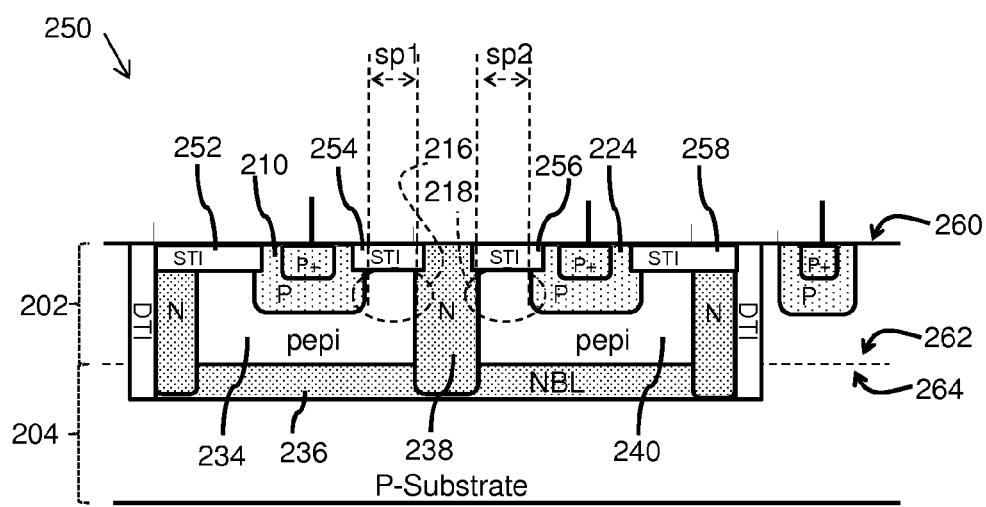

FIG. 2b schematically shows a cross-sectional view of a structure of a similar example of a semiconductor device 250. The semiconductor device 250 comprises the same elements as semiconductor device 200 and comprises additional shallow trench isolation structures 252, 254, 256, 258. Shallow trench isolation structures are present at the surface of the p-doped epitaxy layer 202 and extend a limited distance into this p-doped epitaxy layer 202. Shallow trench isolation structures 252, 258 are present between the Deep Trench Isolation structure DTI and, respectively, the first p-doped region 210 and the second p-doped region 224. Shallow trench isolation structures 254, 256 are present between the N-doped region 238 and, respectively, the first p-doped region 210 and the second p-doped region 224. It is to be noted that the first section 216 is now a section of the first portion 234 below (seen from the first side) the shallow trench isolation 254 and in between the first p-doped region 210 and the N-doped region 238. It is to be noted that the second section 218 is now a section of the second portion 240 below the shallow trench isolation 256 and in between the second p-doped region 224 and the N-doped region 238. It is to be noted that the operation of the semiconductor devices 250 is better controllable than the operation of semiconductor device 200, however, the basic principles of the operation of both semiconductor devices 200, 250 are similar.

In FIG. 2b specific surfaces of the p-doped substrate and the p-doped epitaxy layer 202 are indicated. The p-doped epitaxy layer 202 is manufactured on top of the p-doped substrate 202. Thus, before the deposition of the p-doped epitaxy layer 202 on the p-doped substrate 202, the p-doped substrate had a first side 262. The N-buried layer NBL, 236 extends from to the first side 262 of the p-doped substrate into the p-doped substrate 204. The p-doped epitaxy layer 202 has a first side 264 which is in contact with the first side 262 of the p-doped substrate 204. The p-doped epitaxy layer 202 further has a second side 260 which is opposite the first side 264 of the p-doped epitaxy layer 202.

Figure 3A:
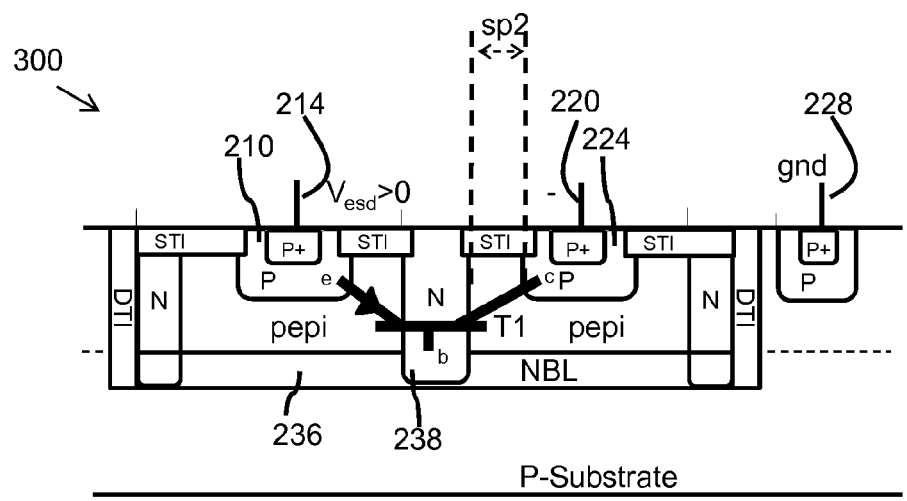
Figure 3B:
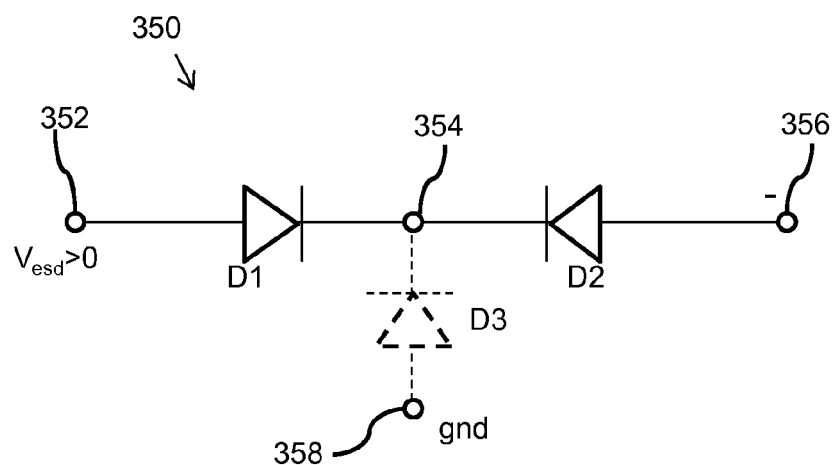

The operation of the semiconductor devices 200, 250 is discussed hereinafter in the description of FIGS. 3a, 3b, 4a, 4b, 5a and 5b. The structure of the semiconductor devices 200, 250 represents an ESD protection device which is used to protect other circuitry on the same semiconductor devices 200, 250 against sudden ESD events of a relatively high or relatively low voltage. FIGS. 3a and 3b relate to an ESD event of a relatively large positive voltage. FIGS. 4a, 4b, 5a and 5b relate to an ESD event of a negative voltage with a relatively large absolute amount. FIG. 3a schematically shows an operation of an example of a semiconductor device 300 in case a positive ESD event is received. It is assumed that the first electrical contact 214 is connected to a part of the semiconductor device which receives an ESD event. In this specific case of FIG. 3a, the first electrical contact 214 receives a fast raising positive voltage. The second electrical contact 220 is connected to a negative voltage and the third electrical contact 228 is connected to a ground voltage gnd. The p-n junction from the first p-doped region 210 to the N-doped region 238 and the n-p junction from the N-doped region 238 to the second p-doped region 224 form a pnp transistor which is indicated in the figure with T1. The first p-doped region 210 forms an emitter of the transistor T1. The second p-doped region 224 forms a collector of the transistor T1. The N-doped region 238 forms a base of the transistor T1. The voltage of the base of the transistor T1 is floating. When the voltage received at the first electrical contact raises, the voltage of the first p-doped region 210 raises and the voltage of the N-doped region 238 raises because the p-n junction from the first p-doped region to the N-doped region 238 is forward biased. The n-p junction from the N-doped region 238 to the second p-doped region 224 is reversed biased. At a certain ESD voltage, the voltage difference between the N-doped region 238 and the second p-doped region 224 becomes equal to the breakdown voltage of the reversed biased n-p junction and a current starts to flow from the first electrical contact 214 via the first p-doped region 210, the N-doped region 238, the second p-doped region 224 to the second electrical contact 220. This current switches on transistor T1. From this point onwards the charge of the ESD event is successfully conducted by the transistor T1 to a voltage supply line of the circuitry with a lower voltage and the voltage of the ESD event does not rise to dangerous levels. Because a pnp transistor T1 is formed, the circuit does not show a strong snapback behaviour, especially, when compared to the closest prior art in which an Silicon Controlled Rectifier is formed by the structure of the prior art. When the transistor T1 has been switched on it shows an ohmic behaviour and the voltage across the ESD protection device increases linearly with an increasing current.

As discussed above, the ESD protection device, which is implemented in the semiconductor device 300, starts its operation when the n-p junction from the N-doped region 238 to the second p-doped region 224 breaks down. The voltage at which this breakdown happens is defined by the breakdown voltage of the n-p junction from the N-doped region 238 to the second p-doped region 224. This breakdown voltage strongly depends on the distance between the N-doped region 238 and the second p-doped region 224. This distance is being indicated in FIG. 3a with the second spacing distance sp2. Thus, the trigger voltage of the ESD device, in relation to positive ESD events, is scalable by manufacturing a specific semiconductor device 300 which has a specific breakdown voltage for the n-p junction from the N-doped region 238 to the second p-doped region 224, and, thus, has the second spacing distance sp2.

FIG. 3b schematically shows a circuit diagram 350 of the example of a semiconductor device 300 in case a positive ESD event is received. The circuit 350 comprises a first terminal 352 at which EDS event must be received. Thus, the first terminal 352 corresponds to the first electrical contact 214 of the semiconductor devices 300, 250, 200 and is to be connected to, for example, the I/O pad of the semiconductor devices 300, 250, 200. The circuit 350 further comprises a second terminal 356 which must be connected to a negative voltage or a ground voltage—the negative voltage may be the lowest voltage available at the semiconductor device (during normal operation). The second terminal 356 corresponds to the second electrical connection of the semiconductor devices 300, 250, 200. A third terminal 358 is to be connected to a ground voltage and the third terminal corresponds to the third electrical contact of the semiconductor devices 300, 250, 200. The circuit 350 comprises a common terminal 354 which corresponds to the N-doped region 238 of the semiconductor devices 300, 250, 200. The p-n-junction from the first p-doped region 210 to the N-doped region 238 forms a first diode D1, the p-n junction from the second p-doped region 224 to the N-doped region 238 forms a second diode D2 and a p-n junction from the p-doped substrate to the N-buried layer NBL, 236 forms a third diode D3 which has a relatively high breakdown voltage, which is, for example, larger than the breakdown voltage of D2 and/or D2. In an optional embodiment, the breakdown voltage of D3 is larger than 60 volt, or, in another example, larger than 70 volt. The first diode D1 is coupled with is its anode to the first terminal 352 and with its cathode to the common terminal 354. The second diode D2 is coupled with its anode to the second terminal 356 and with its cathode to the common terminal 354. The third diode D3 is coupled with its anode to the third terminal 358 and with its cathode to the common terminal 354. When a positive ESD event is received at the first terminal 352, the first diode D1 and the second diode D2 form the pnp transistor T1. Diode D3 is reverse biased and the voltage across D3 is smaller than the breakdown voltage of D3.

Figure 4A:
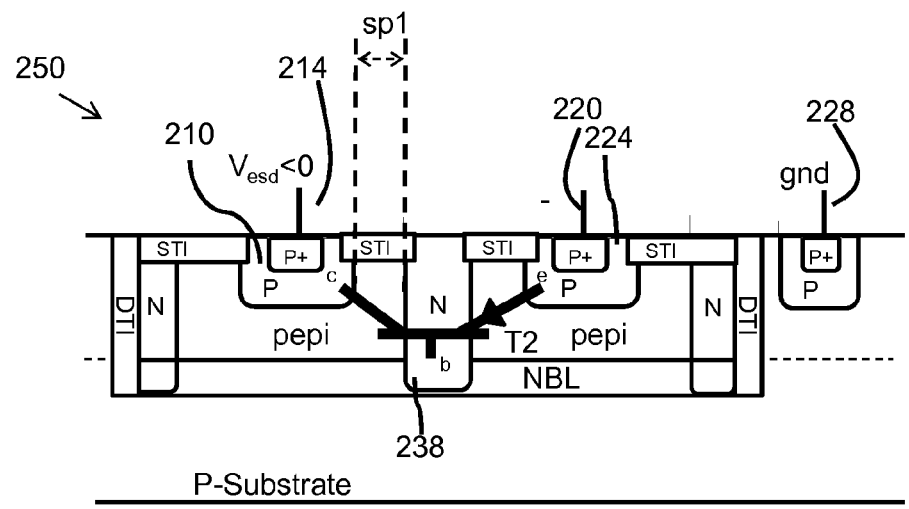

FIG. 4a schematically shows an operation of an example of a semiconductor device 250 in case a negative ESD event is received. In cases of a negative ESD event, the first electrical contact receives a voltage which drops, relatively fast, towards a relatively low negative voltage. The structure of the semiconductor device 250 forms in that situation a pnp transistor T2 of which the first p-doped region 210 is the collector, the second p-doped 224 region is the emitter and the N-doped region forms the base. As soon as the negative voltage received by the first p-doped region exceeds the breakdown voltage of the n-p junction between the N-doped region 238 and the first p-doped region, a current starts to flow from the N-doped region 238 to the first p-doped region 210 and the pnp transistor is switched on and the charge of the ESD event is conducted via the current conduction path via the second electrical contact 220, the second p-doped region 224, the N-doped region 238, the first p-doped region 210 and the first electrical contact 214

As discussed above, the ESD protection device, which is implemented in the semiconductor device 250, starts its operation when the n-p junction from the N-doped region 238 to the first p-doped region 210 breaks down. The voltage at which this breakdown happens is defined by the breakdown voltage of the n-p junction from the N-doped region 238 to the first p-doped region 210. This breakdown voltage strongly depends on the distance between the N-doped region 238 and the first p-doped region 210. This distance is being indicated in FIG. 4a with the first spacing distance sp1. Thus, the trigger voltage of the ESD device, in relation to negative ESD events, is scalable by manufacturing a specific semiconductor device 250 which has a specific breakdown voltage for the n-p junction from the N-doped region 238 to the first p-doped region 210, and, thus, has the first spacing distance sp1. Consequently, the ESD protection device which is implemented in the semiconductor devices 200, 250, 300 according to the first aspect of the invention have for the first time the possibility to scale the trigger voltage of the ESD protection device in case of a negative ESD event and the trigger voltage of the ESD protection device in case of a positive ESD event. Hence, the ESD protection device implemented in the semiconductor devices 200, 250, 300 is very flexible with respect to its application in specific integrated circuits and can easily be modified to have a predefined behaviour. Thus, the trigger voltages of the ESD protection device, respectively in relation to negatively and in relation to positively polarized ESD events, can be well scaled.

Figure 4B:
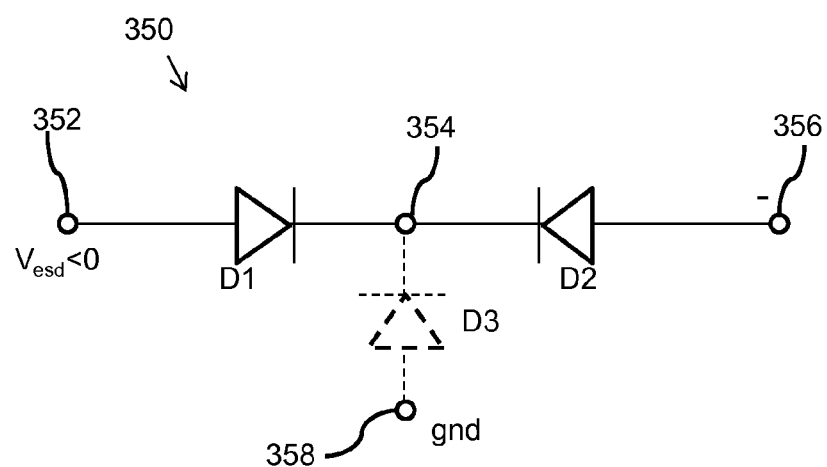

FIG. 4b schematically shows a circuit diagram of the example of a semiconductor device in case a negative ESD event is received. The circuit diagram is similar to the circuit diagram of FIG. 3b.

Figure 5A:
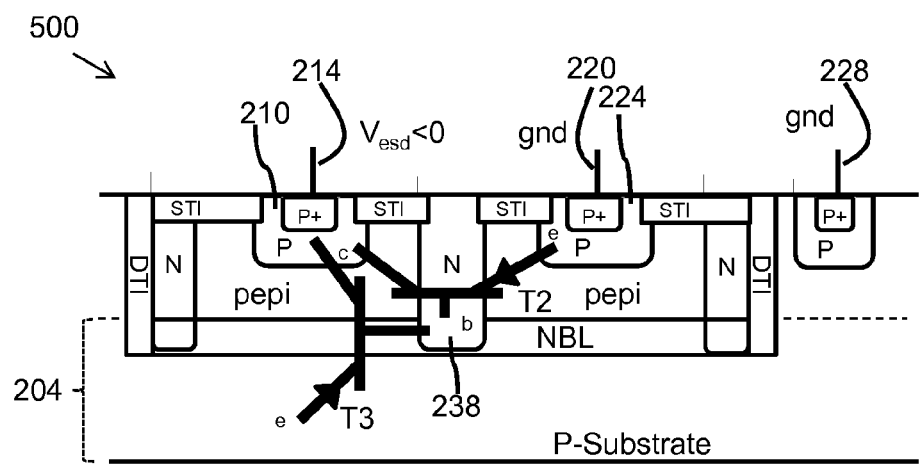
Figure 5B:
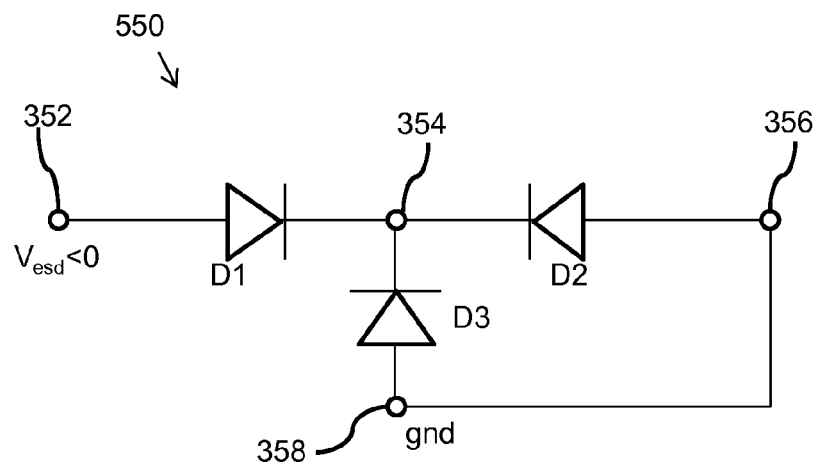

FIG. 5a schematically shows an operation of another example of a semiconductor device 500 in case a negatively polarized ESD event is received. The semiconductor device 500 is similar to semiconductor device 250, however, it differs with respect to the voltage to which the second electrical connection is coupled. In the semiconductor device 500 the second electrical contact 200 and the third electrical contact 228 are coupled to the ground voltage gnd. As may be seen in FIG. 5b, this results in coupling the diodes D2 and D3 in parallel. Further, as shown in FIG. 5a, this results in two pnp transistors T2, T3 which are coupled both with their collector to the first p-doped region 210, which are both coupled with their base to the N-doped region 238 and which are both coupled with their emitted to the ground voltage gnd. The emitter of transistor T2 is coupled to the second p-doped region 224 and the emitter of transistor T3 is coupled to the p-doped substrate 204. The arrangement of FIG. 5a better conducts the charge of a negative ESD event towards the ground voltage gnd voltage supply lines because, via diode D3, a low resistive pnp transistor T3 is provided.

Figure 6:
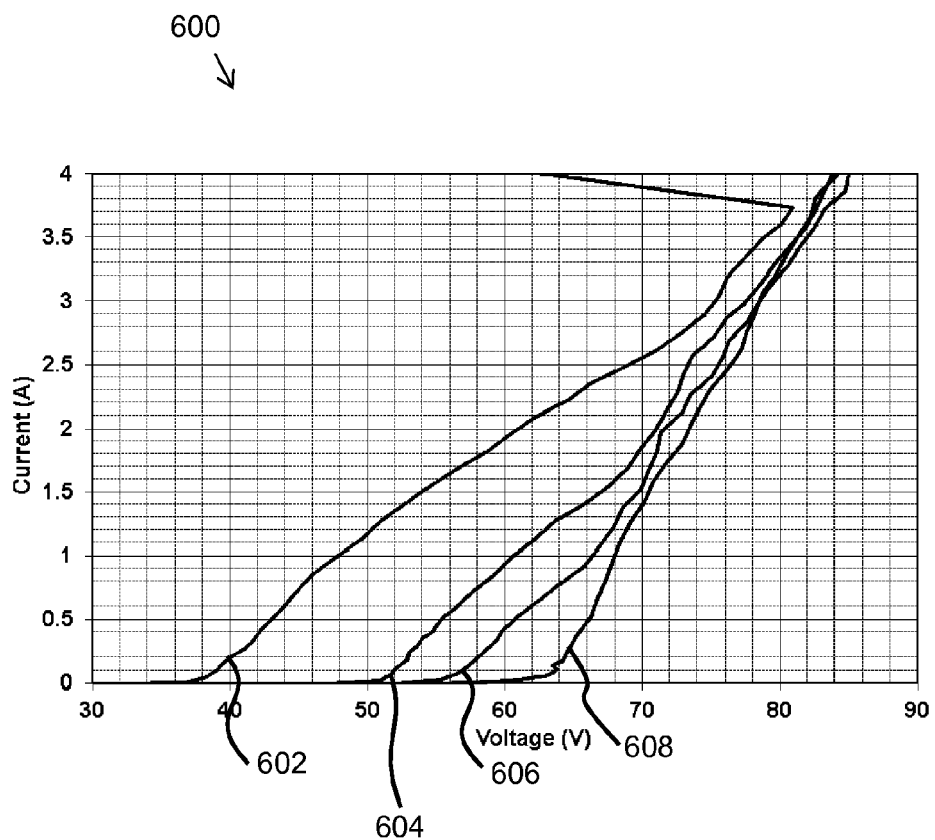

FIG. 6 schematically shows in a chart 600 the operational characteristics of several examples of ESD protection devices implemented in the semiconductor devices 200, 250, 300 according to the first aspect of the invention. The x-axis of the chart represents a voltage of an ESD event, the y-axis represents a current through the ESD protection device. The lines 602, 604, 606, 608 represent the operation of different ESD protection device implemented in different semiconductor devices. As seen in FIG. 6, the different semiconductor devices have different trigger voltages, and, thus, different spacing distances sp1 and sp2 formed by the first section 216 and/or of the second section 218. Chart 600 shows that the trigger voltage of the ESD protection devices are well scalable in a relatively wide range. Chart 600 further shows that from the moment that the ESD protection device starts to conduct the ESD charge, substantially no snapback behaviour is observed. Thus, the ESD devices, which are implemented in the semiconductor devices 200, 250, 300 according to the first aspect of the invention, can be used in situations wherein a snapback behaviour is not desired.

Figure 7:
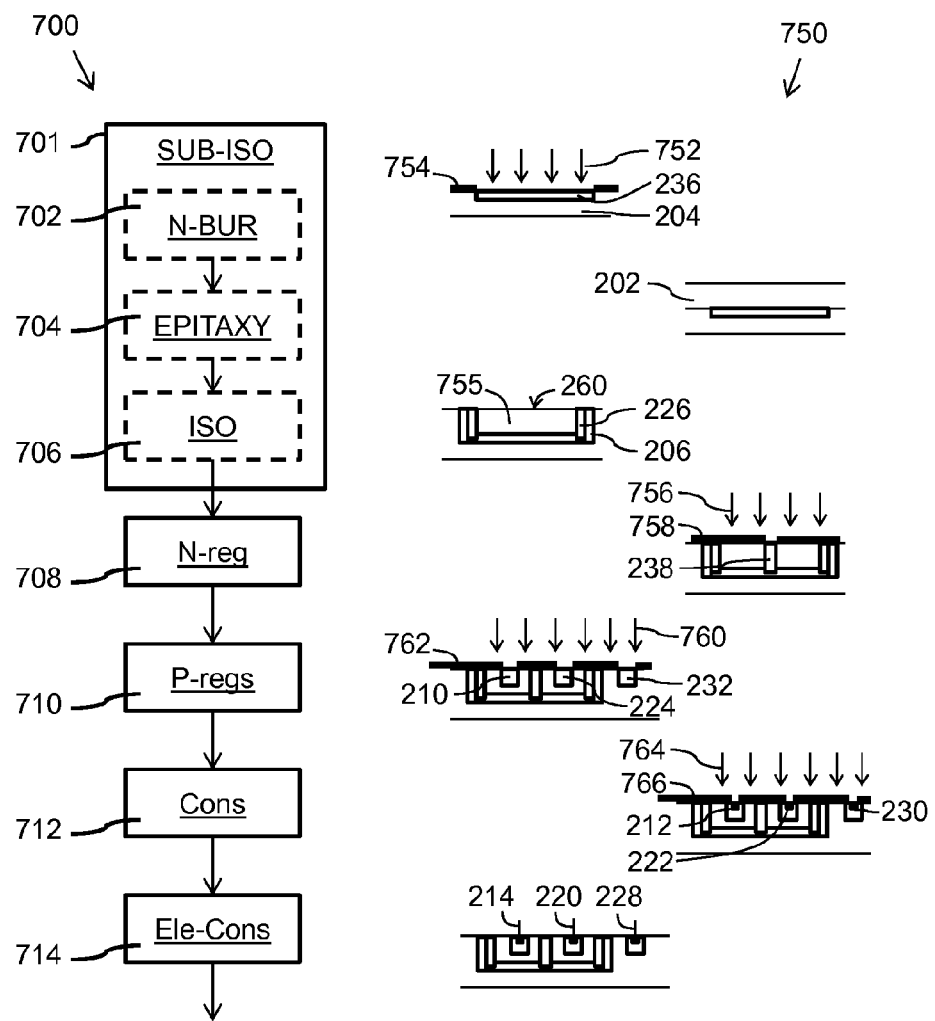

FIG. 7 schematically shows a manufacturing method 700 of manufacturing a semiconductor device which comprises an ESD protection device at the left end of FIG. 7. At the right end of FIG. 7 intermediate manufacturing results 750 are presented.

In stage 701, SUB-ISO a semiconductor substrate is obtained which comprises a p-doped isolated portion 755. The p-doped isolated portion 755 has a top surface 260.

In an optional embodiment, the stage 701, SUB-ISO of obtaining the semiconductor substrate with the p-doped isolated portion 755 comprises a stage 702, N-BUR of manufacturing an N-buried layer 236 in at a first side of a p-doped substrate 204. In an optional embodiment this may be done by creating a patterned photoresist layer 754 at the first side of the p-doped substrate 204 by, for example, known photolithographic techniques. When the patterned photoresist 754 layer is present at the first side surface, N implantation 752 is implanted in the region which is not covered by the pattered photoresist layer 754. After implanting the N implantation 752, the photoresist layer 754 is removed.

In an optional embodiment, the stage 701, SUB-ISO of obtaining the semiconductor substrate with the p-doped isolated portion 755 comprises a stage 704, EPITAXY of providing a p-doped epitaxy layer on top of the first side of the p-doped substrate 204. A first side of the p-doped epitaxy layer faces the first side of the p-doped substrate and the p-doped epitaxy layer has a second side which is opposite its first side. The second side of the p-doped epitaxy layer is the top surface of the p-doped isolated portion 755. In an optional embodiment, the p-doped epitaxy layer may be deposited on the p-doped substrate. The p-dopant concentration in the p-doped epitaxy layer may differ from the p-dopant concentration of the p-doped substrate In an optional embodiment the p-doped epitaxy layer and the p-doped substrate comprise a similar dopant concentration.

In an optional embodiment, the stage 701, SUB-ISO of obtaining the semiconductor substrate with the p-doped isolated portion 755 comprises a stage 706, ISO of manufacturing an isolation structure around the p-doped isolated portion such that the N-buried layer is part of the isolation structure. In an optional embodiment a Deep Trench Isolation structure is manufactured which extends from the top surface completely towards the N-buried layer. In a further optional embodiment, additional N-doped region is manufactured adjacent to the Deep Trench Isolation structure, the additional N-doped region extends from the top surface towards the N-buried layer. Manufacturing such an additional N-doped region may be done by known photolithographic techniques and known implantation techniques.

In stage 708, N-reg an N-doped region 238 is manufactured in the p-doped isolated portion 755. The N-doped region extends from the top surface towards an opposite side of the p-doped isolated region (when an N-buried layer is present, the N-doped region 238 extends towards the N-buried layer). The N-doped region 238 is arranged such that it subdivides the p-doped isolated portion into a first portion and a second portion. In an optional embodiment, the current stage 708 may be performed by creating a patterned photoresist layer 758 at the top surface of the p-doped isolated region by, for example, known photolithographic techniques. When the patterned photoresist 758 layer is present at the top surface, N implantation 756 is implanted in the region which is not covered by the pattered photoresist layer 758. After implanting the N implantation 756, the photoresist layer 758 is removed.

In stage 710, P-regs a first p-doped region 210 and a second p-doped region 224 are manufactured into, respectively, the first portion and the second portion. The manufactured first p-doped region 210 and the manufactured second p-doped region 224 extend from the top surface into, respectively, the first portion and the second portion. Further, the manufactured first p-doped region 210 and the manufactured second p-doped region 224 have a p-dopant concentration which is higher than the p-dopant concentration of the p-doped isolated portion. In an optional embodiment, the current stage 710, P-regs may be performed by creating a patterned photoresist layer 762 at the top surface of the p-doped isolated region by, for example, known photolithographic techniques. When the patterned photoresist 762 layer is present at the top surface, P implantation 760 is implanted in the regions which are not covered by the pattered photoresist layer 762. After implanting the P implantation 760, the photoresist layer 762 is removed. In an optional embodiment, the current stage 710, P-regs may also comprise the manufacturing of a third p-doped region 232 in a remaining portion of the semiconductor substrate. The remaining portion of the semiconductor substrate is a portion different from the isolated portion. The third p-doped region 232 extends from the top surface into the remaining portion. The p-dopant concentration of the third p-doped region 232 is larger than the p-dopant concentration of the semiconductor substrate.

In stage 712, Cons only a first contact region 212 and only a second contact region 222 are manufactured into, respectively, the first p-doped region and the second p-doped region. The first contact region 212 and the second contact region 222 extend from the top surface into, respectively, the first p-doped region and the second p-doped region. The manufactured first contact region 212 and the manufactured second contact 222 region have a p-dopant concentration which is larger than the p-dopant concentration of, respectively, the first p-doped region and the second p-doped region. In an optional embodiment, the current stage 712, Cons may be performed by creating a patterned photoresist layer 766 at the top surface of the p-doped isolated region by, for example, known photolithographic techniques. When the patterned photoresist 766 layer is present at the top surface, P implantation 764 is implanted in the regions which are not covered by the pattered photoresist layer 766. After implanting the P implantation 764, the photoresist layer 766 is removed. In an optional embodiment, the current stage 712, Cons may also comprise the manufacturing of a third contact region 230 in the third p-doped region. The third contact region 230 extends from the top surface into the third p-doped region. The p-dopant concentration of the third contact region 230 is larger than the p-dopant concentration of the third p-doped region.

In a stage 714, Ele-Cons first electrical contact to the first contact region is provided and a second electrical contact to the second contact region is provided. In an optional embodiment, a third electrical contact to the third contact region. The first electrical contact, the second electrical contact and/or the third electrical contact may be created by creating contact holes in an insulation layer which is manufactured on top of the top surface and by creating electrical connections in one of the patterned metal layers which are manufactured on top of the insulation layer.

It is to be noted that additional details of the manufacturing method of the semiconductor device may, for example, be found in US2011/0176244.

Summarized, the current application relates to A semiconductor device which comprises an ESD protection device. The ESD protection device is being formed by one or more pnp transistors which are present in the structure of the semiconductor device. The semiconductor device comprises two portions of an isolated p-doped region which are separated by an N-doped region. Two p-doped regions are provided within the two portions. The p-dopant concentration of the two-doped region is higher than the p-dopant concentration of the isolated p-doped region. A first electrical contact is connected only via a highly doped p-contact region to the first p-doped region and a second electrical contact is connected only via another highly doped p-contact region to the second p-doped region.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above. As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as, for example, and not intended to be limiting, semiconductor-on-insulation (SOI) structures, and combinations therefore. For convenience of explanation and not intended to be limiting, semiconductor devices and methods of fabrication are described herein for silicon semiconductors but persons skilled in the art will understand that other semiconductor materials may also be used. Additionally, various device types and/or dopes semiconductor regions may be identified as being of N type or P type, but this is merely for convenience of description and not intended to be limiting, and such identification may be replaced by the more general description of being of a "first conductivity type" or a "second, opposite, conductivity type" where the first type may be either N or P type and the second type then is either P or N type.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality. It is further to be noted, when two components of an electronic circuit or of a semiconductor device are "coupled" to each other, there is at least an electrical conducting path between them. However, "coupling" does not mean that no other devices may be present between the two components and when two components are coupled to each other, other electronic components may be present on the electrical connection between the two components.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. For example, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A semiconductor device comprising an ESD protection device for protecting an integrated circuit on the semiconductor device against ESD event received by the integrated circuit, the ESD protection device comprising
   a semiconductor substrate, the semiconductor substrate having a first side, the semiconductor substrate having an N-buried region extending in a lateral direction in the interior of the semiconductor substrate,
   a p-doped isolated portion of the semiconductor substrate being isolated from a remaining part of the semiconductor substrate by an isolation structure, the isolation structure comprising the N-buried region,
   an N-doped region being arranged in the p-doped isolated portion and extending from the first side towards the N-buried region, the N-doped region subdividing the isolated portion in a first portion and a second portion,
   a first p-doped region and a second p-doped region extending from the first side into, respectively, the first portion and the second portion, the p-dopant concentration of the first p-doped region and of the second p-doped region being higher than the p-dopant concentration of the first portion and the second portion,
   a first contact region and a second contact region extending from the first side, respectively, into the first p-doped region and into the second p-doped region, the first contact region and the second contact region being p-doped with a dopant concentration being higher than the p-dopant concentration of the first p-doped region and of the second p-doped region,
   a first electrical contact being electrically connected to the first p-doped region only via the first contact region, the first electrical contact being configured for being connected to an I/O pad of the semiconductor device,
   a second electrical contact being electrically connected to the second p-doped region only via the second contact region, the second electrical contact being configured for being connected to a most negative voltage available on the semiconductor device under normal operational condition or to a ground voltage,
   a third electrical contact being electrically connected to the remaining part of semiconductor substrate, the third electrical contact being configured for being connected to the ground voltage,
   wherein:
   the second section is configured to provide a first spacing distance between the second p-doped region and the N-doped region to provide a predefined trigger voltage of the ESD protection device in case of a positive voltage ESD event, and
   the first section is configured to provide a second spacing distance between the first p-doped region and the N-doped region to provide a predefined trigger voltage of the ESD protection device in case of a negative voltage ESD event.

2. A semiconductor device according to claim 1, wherein the semiconductor substrate comprising
   a p-doped substrate, the p-doped substrate having a first surface, the p-doped substrate having the N-buried region extending from the first surface of the p-doped substrate into the p-doped substrate,
   a p-doped epitaxy layer being manufactured at the first surface of the p-doped substrate, the p-doped epitaxy layer having a first surface being in contact with the first surface of the p-doped substrate and having a second surface opposite the first surface, the second surface being the first side of the semiconductor substrate, and
   the isolated portion being a portion of the p-doped epitaxy layer.

3. A semiconductor device according to claim 1, wherein the N-doped region and the first p-doped region, and the N-doped region and the second p-doped region are spatially separated by, respectively, a first section and a second section of, respectively, the first portion and the second portion.

4. A semiconductor device according to claim 1, wherein the first side further comprise shallow trench isolation structures, in between the N-doped region and first p-doped region and in between the N-doped region and the second p-doped region.

5. A semiconductor device according to claim 1, wherein the isolation structure further comprises a deep trench isolation structure extending from the first side into the semiconductor substrate, the N-buried region being in contact with the deep trench isolation structure.

6. A semiconductor device according to claim 5, wherein the isolation structure further comprises an N-doped isolation region extending from the first side towards the N-buried region and the N-doped isolation region being adjacent to the deep trench isolation structure.

7. A semiconductor device according to claim 1 further comprising:
   a third p-doped region extending from the first side into the remaining portion of the semiconductor substrate, a p-dopant concentration of the third p-doped region being higher than a p-dopant concentration of the semiconductor substrate,
   a third electrical contact extending from the first side into the third p-doped region, a p-dopant concentration of the third electrical contact being higher than the p-dopant concentration of the third p-doped region, wherein the third electrical connection is connected to the third electrical contact.

8. An ESD protection circuit for protecting an integrated circuit against ESD events received by the integrated circuit, the ESD protection circuit comprising:

a first terminal for being coupled to an IO pad of the integrated circuit, a second terminal for being coupled to a most negative voltage available on the semiconductor device under normal operational condition or to a ground voltage, a third terminal for being coupled to a substrate of a semiconductor device wherein the ESD protection circuit is being manufactured, a common terminal, a first diode, an anode of the first diode being coupled to the first terminal and a cathode of the first diode being coupled to the common terminal, a second diode, an anode of the second diode being coupled to the second terminal and a cathode of the second diode being coupled to the common terminal, and a third diode having a high voltage breakdown voltage, an anode of the third diode being coupled to the third terminal and a cathode of the third diode being coupled to the common terminal.

9. An ESD protection circuit according to claim 8, wherein the high voltage breakdown voltage is at least larger than 70 volts.

10. An ESD protection circuit according to claim 8, wherein the third terminal is coupled via the substrate to a ground voltage.

11. An ESD protection circuit according to claim 8, wherein the second terminal is coupled to the ground voltage.

12. Integrated circuit comprising the ESD protection circuit according to claim 8.

13. Method of manufacturing a semiconductor device comprising an ESD protection device, the method comprising obtaining a p-doped isolated portion in a semiconductor substrate, the p-doped isolated portion having a top surface, manufacturing an N-doped region into the p-doped isolated portion, wherein the N-doped region extends from the top surface towards an opposite side of the p-doped isolated region and wherein the N-doped region subdivides the p-doped isolated portion into a first portion and a second portion, manufacturing a first p-doped region and a second p-doped region into, respectively, the first portion and the second portion, wherein the first p-doped region and the second p-doped region extend from the top surface into, respectively, the first portion and the second portion, the manufactured first p-doped region and the manufactured second p-doped region have a p-dopant concentration being higher than the p-dopant concentration of the p-doped isolated portion, manufacturing a first contact region and a second contact region into, respectively, the first p-doped region and the second p-doped region, the first contact region and the second contact region extends from the top surface into, respectively, the first p-doped region and the second p-doped region, the first contact region and the second contact region have a p-dopant concentration being larger than the p-dopant concentration of, respectively, the first p-doped region and the second p-doped region, providing a first electrical contact only to the first contact region and providing a second electrical contact only to the second contact region, wherein:

the second portion is configured to provide a first spacing distance between the second p-doped region and the N-doped region to provide a predefined trigger voltage of the ESD protection device in case of a positive voltage ESD event, and the first portion is configured to provide a second spacing distance between the first p-doped region and the N-doped region to provide a predefined trigger voltage of the ESD protection device in case of a negative voltage ESD event.

14. Method of manufacturing a semiconductor device according to claim 13, wherein the stage of obtaining the p-doped isolated portion comprises the stages of:

manufacturing an N-buried region at a first surface of a p-doped substrate, providing a p-doped epitaxy layer on top of the first surface of the p-doped substrate, the p-doped epitaxy layer comprising a first surface facing the first surface of the p-doped substrate and having a second surface being opposite its first surface, the second surface being the top surface of the p-doped isolated portion, and manufacturing an isolation structure around the p-doped isolated portion, wherein the N-buried region being part of the isolation structure.

15. Method of manufacturing a semiconductor device according to claim 13, wherein the semiconductor substrate is p-doped, and wherein:

the stage of manufacturing the first p-doped region and the second p-doped region further comprises the manufacturing of a third p-doped region in a remaining portion of the semiconductor substrate, the remaining portion is a portion of the semiconductor substrate different from the isolated portion, the third p-doped region extends from the top surface into the remaining portion, the p-dopant concentration of the third p-doped region is larger than the p-dopant concentration of the semiconductor substrate.

16. Method of manufacturing a semiconductor device according to claim 15, wherein the stage of manufacturing the first contact region and the second contact region further comprises the manufacturing of a third contact region in the third p-doped region, the third contact region extends from the top surface into the third p-doped region, the p-dopant concentration of the third contact region is larger than the p-dopant concentration of the third p-doped region.

17. Method of manufacturing a semiconductor device according to claim 16, wherein the stage of providing a first electrical contact and a second electrical contact further comprises providing a third electrical contact to the third contact region.

* * * * *